(12) United States Patent
Boyd et al.

(10) Patent No.: US 12,180,065 B2
(45) Date of Patent: *Dec. 31, 2024

(54) MICROELECTROMECHANICAL SYSTEM AND PROCESS OF MAKING IT

(71) Applicant: AAC ACOUSTIC TECHNOLOGIES (SHENZHEN) CO., LTD., Shenzhen (CN)

(72) Inventors: Euan James Boyd, Edinburgh (GB); Colin Robert Jenkins, Edinburgh (GB)

(73) Assignee: AAC ACOUSTIC TECHNOLOGIES (SHENZHEN) CO., LTD., Shenzhen (CN)

(*) Notice: Subject to any disclaimer, the term of this patent is extended or adjusted under 35 U.S.C. 154(b) by 471 days.

This patent is subject to a terminal disclaimer.

(21) Appl. No.: 17/214,954

(22) Filed: Mar. 29, 2021

(65) Prior Publication Data
US 2022/0306455 A1    Sep. 29, 2022

(51) Int. Cl.
*B81C 1/00* (2006.01)
*B81B 3/00* (2006.01)
*H04R 7/06* (2006.01)
*H04R 19/04* (2006.01)

(52) U.S. Cl.
CPC ........ *B81B 3/0086* (2013.01); *B81C 1/00698* (2013.01); *H04R 7/06* (2013.01); *H04R 19/04* (2013.01); *B81B 2201/0257* (2013.01); *B81B 2203/0127* (2013.01); *B81B 2203/0315* (2013.01); *B81B 2203/0361* (2013.01); *B81B 2203/04* (2013.01); *B81C 2201/0133* (2013.01); *H04R 2201/003* (2013.01)

(58) Field of Classification Search
None
See application file for complete search history.

(56) References Cited

U.S. PATENT DOCUMENTS 11,405,731 B1 * 8/2022 Boyd .................... B81B 3/0067

\* cited by examiner

*Primary Examiner* — Hrayr A Sayadian
(74) *Attorney, Agent, or Firm* — W&G Law Group

(57) ABSTRACT

A microelectromechanical system includes a lower membrane including a plurality of troughs and crests arranged alternately, an upper membrane including a plurality of troughs and crests arranged alternately, and a spacer layer disposed between the lower membrane and the upper membrane. The spacer layer includes counter electrode walls and support walls made of nitride, the counter electrode walls being provided with conductive elements. Chambers are formed between the troughs of the lower membrane and the crest of the upper membrane and the counter electrode walls are suspended in the chambers respectively. The support walls are sandwiched between the crests of the lower membrane and the troughs of the upper membrane with a space formed between adjacent support walls. The spaces between adjacent support walls may be empty or filled with oxide. Unwanted capacitance between the upper and lower membranes is reduced significantly.

8 Claims, 4 Drawing Sheets

MICROELECTROMECHANICAL SYSTEM AND PROCESS OF MAKING IT

FIELD OF THE INVENTION

The present disclosure relates to the field of electro-acoustic conversion devices, and in particular, to a microelectromechanical system for electro-acoustic conversion devices.

BACKGROUND

In a current corrugated encapsulated microelectromechanical system microphone with upper and lower corrugated membranes, there is a spacer layer which connects the upper and lower corrugated membranes. Traditionally, the spacer layer is made by the same material that is used for the counter electrode which sits within the membrane. The spacer layer is typically made of silicon nitride due to its superior mechanical properties.

However, the dielectric constant of silicon nitride is as high as 9.5. In the implementation of the corrugated encapsulated membrane using a conductive material, such as poly-silicon, a very high plate to plate capacitance is generated between the membranes, which would negatively impact the performance of the microphone.

Therefore, it is desired to provide an improved microelectromechanical system which can overcome at least one of the above problems.

SUMMARY

In one aspect, the present disclosure provides a process of making a microelectromechanical system. The process comprises:
  providing a lower membrane;
  forming a spacer layer on the lower membrane, comprising:
    forming multiple counter electrode walls and a plurality of support walls by a first material on the lower membrane, a space being formed between adjacent walls; and
    filling the spaces with a second material, the second material having a dielectric constant less than that of the first material;
  providing an upper membrane covered on the spacer layer; and
  releasing the second material around the counter electrode walls such that portions of the lower membrane and upper membrane aligned with counter electrode walls are displaceable relative to the counter electrode walls.

In some embodiments, the lower membrane comprising a plurality of troughs and crests arranged alternately; and providing a lower membrane comprises:
  providing the lower membrane with the troughs filled with the second material.

In some embodiments, forming multiple counter electrode walls and a plurality of support walls on the lower membrane comprises:
  forming the multiple counter electrode walls on the second material filled in the troughs of the lower membrane and the plurality of support walls on the crests of the lower membrane.

In some embodiments, the upper membrane comprises a plurality of troughs and crests arranged alternately; and providing the upper membrane covered on the spacer layer comprises:
  providing the upper membrane with recesses formed below the crests thereof filled with the second material. The crests of the upper membrane are aligned with the troughs of the lower membrane respectively to form chambers with the counter electrode walls located therein, and the troughs of the upper membrane are respectively aligned with the crests of the lower membrane with the support walls sandwiched therebetween.

In some embodiments, releasing the second material around the counter electrode walls comprises:
  releasing the second material around the counter electrode walls by etching. One or both of aligned crest of the upper membrane and trough of the lower membrane define a through hole to allow etching solution to flow into the chamber when releasing the second material around the counter electrode walls by etching.

In some embodiments, one or both of aligned trough of the upper membrane and crest of the lower membrane define a through hole to allow the etching solution to flow into the space formed between adjacent support walls to thereby release the second material filled in the space formed between adjacent support walls when releasing the second material around the counter electrode walls by etching.

In another aspect, the present disclosure provides a microelectromechanical system which comprises a lower membrane; an upper membrane; and a spacer layer disposed between the lower membrane and the upper membrane. The spacer layer comprises counter electrode walls with conductive elements and support walls. Chambers are formed between the lower membrane and the upper membrane and the counter electrode walls are suspended in the chambers respectively. The support walls are sandwiched between the lower membrane and the upper membrane with a space formed between adjacent support walls.

In some embodiments, the lower membrane comprises a plurality of troughs and crests arranged alternately, the upper membrane comprising a plurality of troughs and crests arranged alternately, the trough of the lower membrane are aligned with the crests of the upper membrane respectively while the crests of the lower membrane are aligned with the trough of the upper membrane respectively, the chambers are respectively formed between aligned troughs of the lower membrane and crests of the upper membrane, and the support walls are respectively sandwiched between the crests of the lower membrane and the troughs of the upper membrane.

In some embodiments, the spaces are respectively formed between the crests of the lower membrane and the troughs of the upper membrane.

In some embodiments, the counter electrode walls and support walls are made of a first material, and the space is filled with a second material having a dielectric constant less than that of the first material.

In some embodiments, the first material is silicon nitride and the second material is silicon oxide.

In some embodiments, the chamber is isolated from adjacent spaces by corresponding support walls.

In some embodiments, one or both of aligned crest of the upper membrane and trough of the lower membrane define a through hole communicating the chamber with outside of the chamber.

In some embodiments, one or both of aligned crest of the lower membrane and trough of the upper membrane define a through hole communicating the space with outside of the space.

BRIEF DESCRIPTION OF THE DRAWINGS

In order to explain the technical solutions of the embodiments of the present disclosure more clearly, accompanying drawings used to describe the embodiments are briefly introduced below. It is evident that the drawings in the following description are only concerned with some embodiments of the present disclosure. For those skilled in the art, in a case where no inventive effort is made, other drawings may be obtained based on these drawings.

DESCRIPTION OF THE EMBODIMENTS

Figure 1:
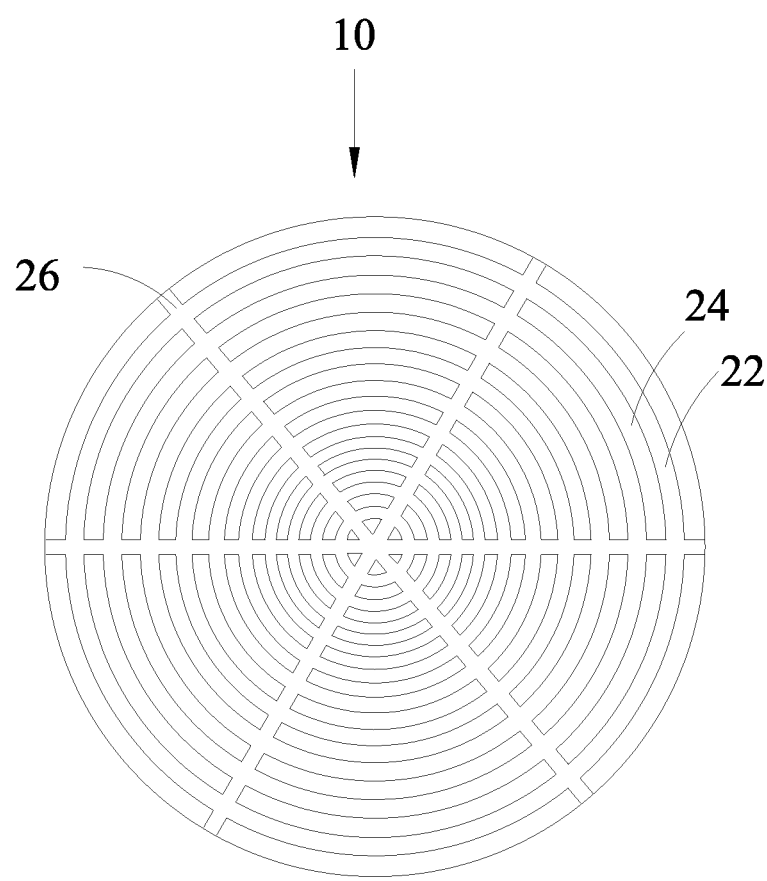
FIG. 1 is a plan view of the microelectromechanical system.

The present disclosure will be further illustrated with reference to the accompanying drawings. It shall be noted that the elements of similar structures or functions are represented by like reference numerals throughout the figures. The embodiments described herein are not intended as an exhaustive illustration or description of various other embodiments or as a limitation on the scope of the claims or the scope of some other embodiments that are apparent to one of ordinary skills in the art in view of the embodiments described in the Application. In addition, an illustrated embodiment need not have all the aspects or advantages shown.

FIG. 1 is a plan view of the microelectromechanical system 10 in accordance of an embodiment of the present invention. FIG. 2 to FIG. 6 illustrate a process of making a microelectromechanical system 10.

Figure 6:
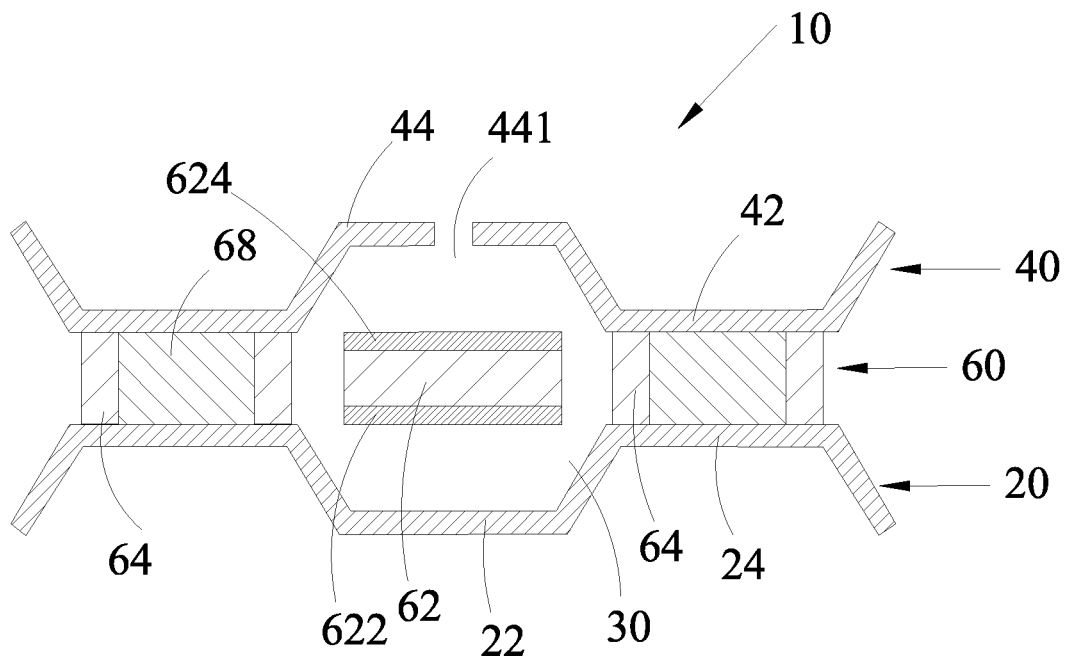
Figure 7:
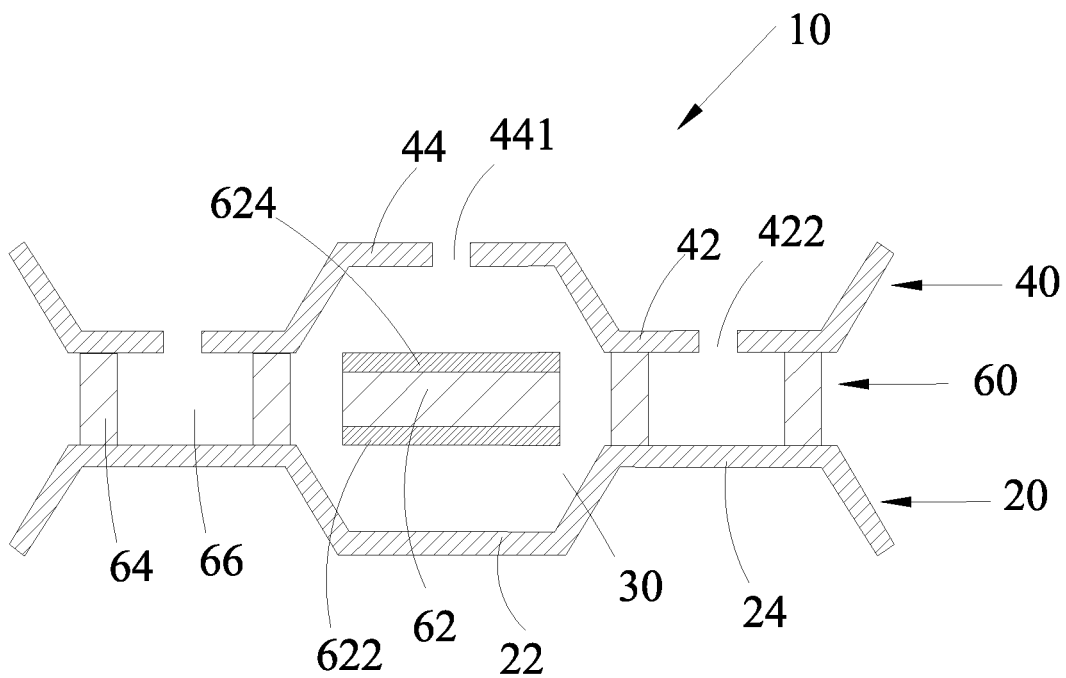
FIG. 7 illustrates a microelectromechanical system in accordance with an alternative embodiment of the present disclosure.

Referring to FIG. 6 and FIG. 7, the microelectromechanical system 10 comprises a lower membrane 20, an upper membrane 40 and a spacer layer 60 disposed between the lower membrane 20 and the upper membrane 40.

Specifically, the lower membrane 20 comprises a plurality of troughs 22 and crests 24 arranged alternately. The upper membrane 40 comprises a plurality of troughs 42 and crests 44 arranged alternately. The trough 22 of the lower membrane 20 are aligned with the crests 44 of the upper membrane 40 respectively while the crests 24 of the lower membrane 20 are aligned with the trough 42 of the upper membrane 40 respectively. The spacer layer 60 is sandwiched between the lower membrane 20 and the upper membrane 40. A chamber 30 is formed between the aligned trough 22 of the lower membrane 20 and the crests 44 of the upper membrane 40. FIG. 6 and FIG. 7 show a partial structure of the microelectromechanical system 10, which consists of a crest 44 of the upper membrane 40 and two troughs 42 on either side of the crest 44, and a trough 22 of the lower membrane 20 and two crests 24 on either side of the trough 22. Microelectromechanical system 10 comprises a plurality of structures shown in FIG. 6 or FIG. 7, and a plurality of structures shown in FIG. 6 or FIG. 7 are connected to form an alternating crest-trough-crest-trough distribution structure of microelectromechanical system 10 as shown in FIG. 1. A chamber 30 is formed between aligned one trough 22 of the lower membrane 20 and one crest 44 of the upper membrane 40. The location of one chamber 30 is indicated in FIG. 6 or FIG. 7.

Referring to FIG. 1, preferably, the lower membrane 20, the upper membrane 40 and the spacer layer 60 are circular. The troughs 22, 42 and crests 24, 44 are arc-shaped and arranged in concentric arcs which span less than 360 degrees. In some embodiments, each of the lower membrane 20 and the upper membrane 40 is divided into six sections in the circumferential direction thereof. Each section comprises a group of troughs 22, 42 and crests 24, 44 arranged alternately in a radial direction of the microelectromechanical system 10. Adjacent sections are connected with each other via a spoke (only 26 shown) which extends along a diameter direction of the microelectromechanical system 10. Each trough 22, 42 and crest 24, 44 spans substantially 60 degrees, and the troughs 22, 42 and crests 24, 44 are evenly or unevenly arranged in the radial direction of the microelectromechanical system 10. Preferably, the troughs 22, 42 and crests 24, 44 are evenly arranged in the radial direction of the microelectromechanical system 10. Alternatively, the lower membrane 20 and the upper membrane 40 can be divided into other number of sections, for example four sections or eight sections and so on. The sections can be evenly or unevenly arranged in the radial direction of the microelectromechanical system 10.

Referring to FIG. 6, the spacer layer 60 comprises a plurality of counter electrode walls 62 accommodated in the chambers 30 and a plurality of support walls 64 sandwiched between the crests 24 of the lower membrane 20 and the trough 42 of the upper membrane 40. The spacer layer 60 has a spider shape similar to the lower membrane 20 and the upper membrane 40. The spacer layer 60 is divided into multiple sections in the circumferential direction thereof. Each section comprises a group of counter electrode walls 62 and support walls 64 arranged alternately in the radial direction of the microelectromechanical system 10. Adjacent sections are connected with each other via a spoke (only 26 shown) which extends along the diameter direction of the microelectromechanical system 10. The counter electrode walls 62 are suspended in the corresponding chambers 30 by the corresponding spokes. In some embodiments, the counter electrode walls 62 and the support walls 64 are arc-shaped. Opposite ends of the counter electrode wall 62 in the circumferential direction of the microelectromechanical system 10 are connected between the adjacent spokes 26 thereby suspend the counter electrode wall 62 in the chamber 30. The counter electrode walls 62 and the support walls 64 are made of a first material which is preferably nitride, such as silicon nitride. Opposite side surfaces of the counter electrode walls 62 facing the lower and upper membrane 20, 40 respectively are provided with conductive elements which act as first and second counter electrodes 622, 624. The support walls 64 are arranged between each crest 24 of the lower membrane 20 and corresponding trough 42 of the upper membrane 40, and a space 66 is formed between aligned one crest 24 of the lower membrane 20 and one trough 42 of the upper membrane 40 and located between two adjacent support walls 64. Each chamber 30 is isolated from adjacent spaces 66 by corresponding support walls 64 which are respectively located between the chamber 30 and the adjacent spaces 66. The spaces 66 may be filled with a filler 68 which is made of a second material such as oxide, for example, silicon oxide. Alternatively, the spaces 66 between adjacent support walls 64 may be void/empty, as shown in FIG. 7.

The lower membrane 20 and the upper membrane 40 may be made of electrically conductive material or comprise an insulating membrane with conductive elements provided thereon. For example, the lower membrane 20 and the upper membrane 40 each comprise a Silicon Nitride membrane with PolySilicon electrodes to provide conduction. Thus, the lower membrane 20 and the upper membrane 40 are electrically conductive. A first capacitance is formed between the lower membrane 20 and the first counter electrode 622 and a second capacitance is formed between the upper membrane 40 and the second counter electrode 624. When the lower/upper membranes 20/40 are displaced relative to the counter electrodes 622/624 in response to a pressure exerted thereon, distances between the lower/upper membranes 20/40 and the counter electrodes 622/624 will change and the capacitance formed therebetween changes accordingly, which results in corresponding electrical signals being generated.

Figure 2:
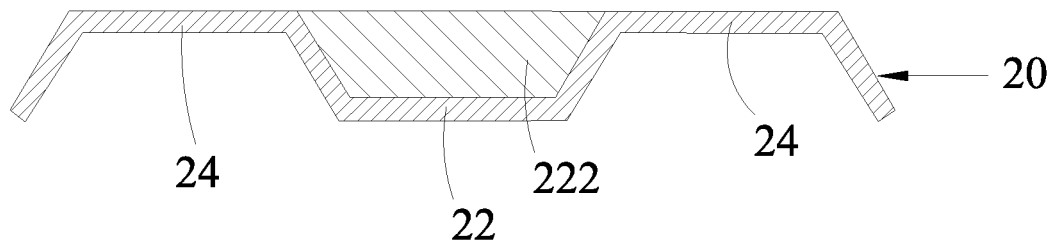
FIG. 2 to FIG. 6 illustrate a process of making a microelectromechanical system in accordance of an embodiment of the present invention.

The process of making the microelectromechanical system 10 comprises the following steps:

Providing a lower membrane 20 as shown in FIG. 2. Specifically, the lower membrane 20 comprises a plurality of troughs 22 and crests 24 arranged alternately. The troughs 22 are filled with filler 222 which may be oxide, for example, silicon oxide. The top surfaces of the fillers 222 are coplanar with the top surfaces of the crests 24.

Figure 3:
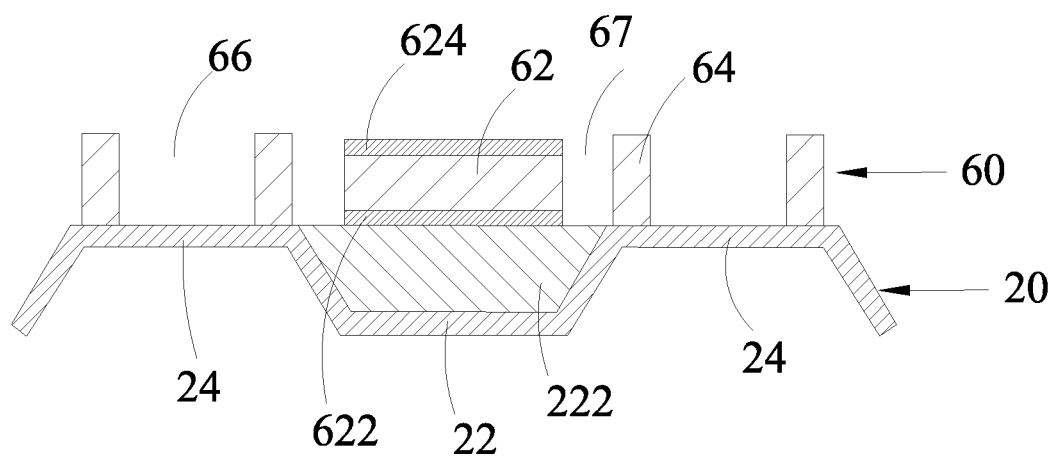

Forming a spacer layer 60 on the lower membrane 20 as shown in FIG. 3. Specifically, forming the spacer layer 60 on the lower membrane 20 comprises:

Forming a plurality of spaced counter electrode walls 62 and support walls 64. The counter electrode walls 62 are disposed on the corresponding fillers 222. The support walls 64 are disposed on the corresponding crests 24. The spaces 66 are formed between adjacent support walls 64. One or more spaces 67 are formed between the counter electrode wall 62 and the corresponding support walls 64 located at opposite sides of the counter electrode wall 62 such that portions of the filler 222 filled in the trough 22 can be exposed via the spaces 67. The space 67 is isolated from the adjacent spaces 66 by the corresponding support walls 64 located between the space 67 and the corresponding spaces 66. The counter electrode walls 62 and support walls 64 can be formed via chemical deposit. Opposite surfaces of the counter electrode walls 62 facing the lower and upper membrane 20, 40 are provided with conductive elements 622, 624 respectively.

Figure 4:
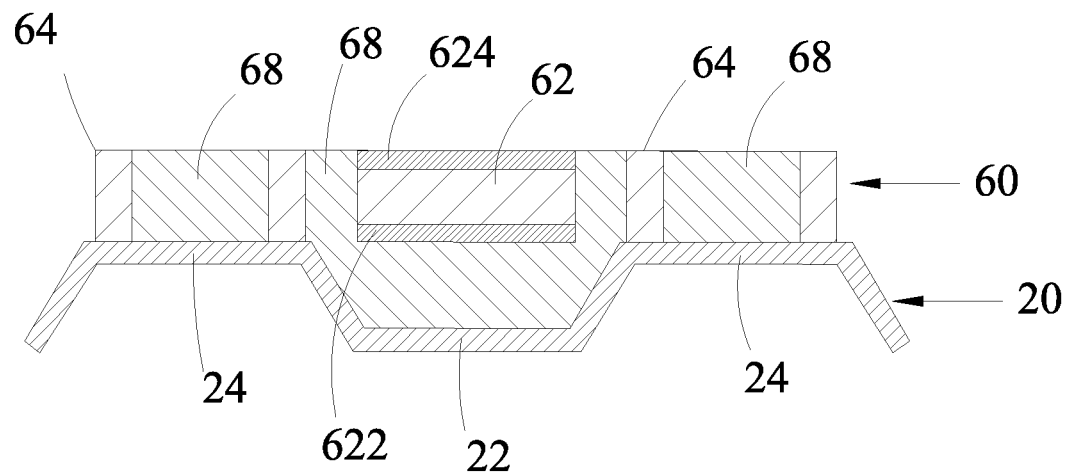

Filling fillers 68 in the spaces 66, 67 formed in the spacer layer 60 as shown in FIG. 4. The fillers 68 are made of a second material. Preferably, the second material is oxide, for example silicon oxide.

Figure 5:
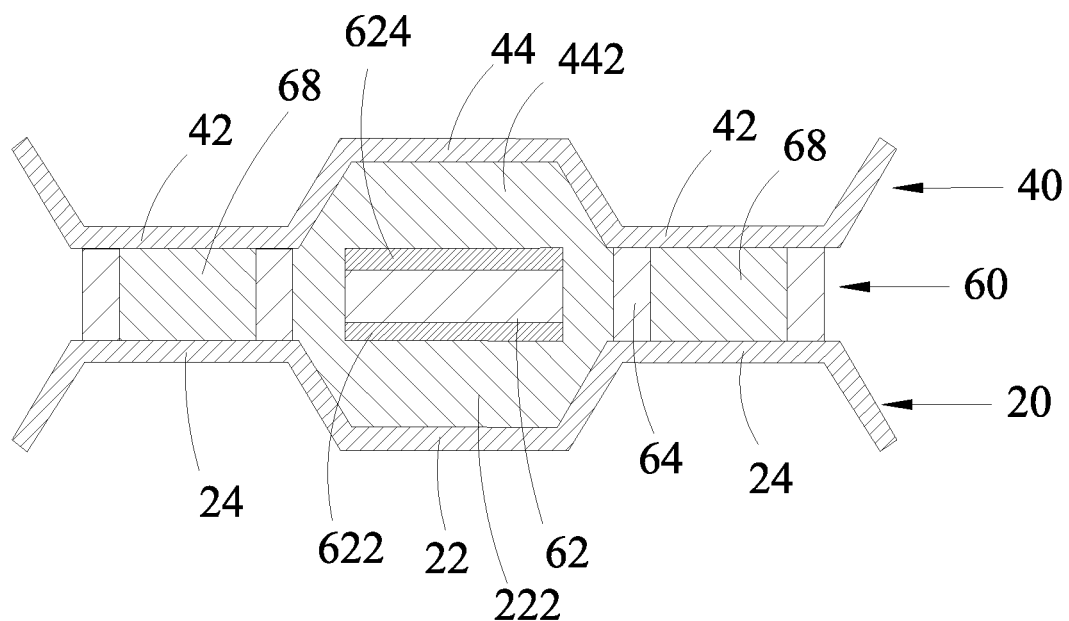

Providing an upper membrane 40 covered on the spacer layer 60 as shown in FIG. 5. Specifically, the upper membrane 40 comprises a plurality of troughs 42 and crests 44 arranged alternately. The troughs 22 of the lower membrane 20 are aligned with the corresponding crests 44 of the upper membrane 40. A recess formed below the crest 44 is filled with a filler 442. The trough 22 of the lower membrane 20, the corresponding crest 44 of the upper membrane 40 and the corresponding support walls 64 cooperatively form an enclosed chamber 30.

Releasing the fillers 222, 442, 68 filled within the enclosed chamber 30 as shown in FIG. 6. Specifically, the fillers 222, 442, 68 are removed by etching. One or both of the trough 22 of the lower membrane 20 and the corresponding crest 44 of the upper membrane 40 define a through hole to allow etching solution to enter into the chamber 30. In this embodiment, the through hole 441 is defined in the crest 44 of the upper membrane 40.

In some embodiments, one or both of the crest 24 of the lower membrane 20 and the corresponding trough 42 of the upper membrane 40 define a through hole to allow etching solution to enter into the corresponding space 66. In this embodiment, the trough 42 of the upper membrane 40 defines a through hole 422. The method further comprises releasing the fillers 68 filled within the spaces 66 formed between the support walls 64. The fillers 68 within the spaces 66 formed between the support walls 64 may be removed after the fillers 222, 442, 68 within the enclosed chamber 30 is removed. Alternatively, the fillers 68 within the spaces 66 formed between the support walls 64 and the fillers 222, 442, 68 within the enclosed chambers 30 may be removed/released at the same step.

In the embodiments described above, the spacer layer 60 is made of more than one kind of material. The counter electrode walls 62 and the support walls 64 are made of nitride while the fillers 68 filled between adjacent support walls 64 are made of oxide which has a dielectric constant less than nitride. Thus, the unwanted capacitance between the upper and lower conductive membranes 40, 20 is reduced significantly. Via using spaced thin nitride support walls 64, the unwanted capacitance between the upper and lower conductive membranes 40, 20 can be reduced by 50% compared to a design where a solid nitride support wall is used. The unwanted capacitance between the upper and lower conductive membranes 40, 20 could be reduced further by releasing the fillers 68 formed between the support walls 64, which could reduce the unwanted capacitance by 80% compared to a design where a solid nitride support wall is used.

Although the invention is described with reference to one or more embodiments, the above description of the embodiments is used only to enable people skilled in the art to practice or use the invention. It should be appreciated by those skilled in the art that various modifications are possible without departing from the spirit or scope of the present invention. The embodiments illustrated above should not be interpreted as limits to the present invention, and the scope of the invention is to be determined by reference to the claims that follow.

What is claimed is:

1. A microelectromechanical system comprising:
   an electrically conductive lower membrane; the lower membrane comprises a plurality of troughs and crests arranged alternately;
   an electrically conductive upper membrane; the upper membrane comprising a plurality of troughs and crests arranged alternately; the trough of the lower membrane are aligned with the crests of the upper membrane respectively while the crests of the lower membrane are aligned with the trough of the upper membrane respectively; and
   a spacer layer disposed between the lower membrane and the upper membrane, the spacer layer comprising counter electrode walls and support walls, the counter electrode walls being provided with conductive elements;
   wherein a chamber is formed between aligned one trough of the lower membrane and one crest of the upper membrane; chambers are respectively formed between aligned troughs of the lower membrane and crests of the upper membrane; the counter electrode walls are suspended in the chambers respectively; and
   the support walls are respectively sandwiched between the crests of the lower membrane and the troughs of the upper membrane; and a space is formed between aligned one crest of the lower membrane and one trough of the upper membrane and located between two adjacent support walls, and spaces are respectively formed between the crests of the lower membrane and the troughs of the upper membrane.

2. The microelectromechanical system of claim 1, wherein the counter electrode walls and support walls are made of a first material, and the space is filled with a second material having a dielectric constant less than that of the first material.

3. The microelectromechanical system of claim 2, wherein the first material is silicon nitride.

4. The microelectromechanical system of claim 2, wherein the second material is silicon oxide.

5. The microelectromechanical system of claim 1, wherein the chambers are isolated from adjacent spaces by corresponding support walls.

6. The microelectromechanical system of claim 1, wherein one or both of aligned crest of the upper membrane and trough of the lower membrane define a through hole communicating the chamber with outside of the chamber.

7. The microelectromechanical system of claim 6, wherein one or both of aligned crest of the lower membrane and trough of the upper membrane defines a through hole communicating the space with outside of the space.

8. The microelectromechanical system of claim 1, wherein the lower membrane is made of electrically conductive material or comprises an insulating membrane with conductive elements provided thereon; and/or the upper membrane is made of electrically conductive material or comprises an insulating membrane with conductive elements provided thereon.

* * * * *